(12) United States Patent
Rezzi et al.

(10) Patent No.: US 7,605,608 B1
(45) Date of Patent: *Oct. 20, 2009

(54) CIRCUIT FOR CONVERTING A VOLTAGE RANGE OF A LOGIC SIGNAL

(75) Inventors: Francesco Rezzi, Cava Manara (IT); Nicola Ghittori, Phittori (IT); Giovanni Antonio Cesura, Cremona (IT); Shafiq M. Jamal, Gilroy, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 11/836,571

(22) Filed: Aug. 9, 2007

Related U.S. Application Data

(60) Provisional application No. 60/821,899, filed on Aug. 9, 2006.

(51) Int. Cl.
*H03K 19/094* (2006.01)
(52) U.S. Cl. .............. 326/68; 326/27; 326/80
(58) Field of Classification Search .......... 326/68, 326/80–83, 86, 87; 327/108, 109, 333
See application file for complete search history.

(56) References Cited

U.S. PATENT DOCUMENTS

| | | | |
|---|---|---|---|
| 3,961,326 A | 6/1976 | Craven | |
| 4,825,099 A | 4/1989 | Barton | |
| 4,937,477 A | 6/1990 | Tsoi et al. | |
| 5,028,817 A * | 7/1991 | Patil | 326/27 |
| 5,128,556 A | 7/1992 | Hirakata | |
| 5,539,341 A | 7/1996 | Kuo | |
| 5,625,360 A | 4/1997 | Garrity et al. | |
| 5,751,186 A | 5/1998 | Nakao et al. | |
| 5,781,026 A | 7/1998 | Chow | |
| 5,900,741 A * | 5/1999 | Roohparvar | 326/34 |
| 5,909,187 A | 6/1999 | Ahuja | |
| 6,100,830 A | 8/2000 | Dedic | |
| 6,188,244 B1 | 2/2001 | Joo et al. | |
| 6,339,344 B1 | 1/2002 | Sakata et al. | |
| 6,407,688 B1 | 6/2002 | Greig | |
| 7,023,367 B1 | 4/2006 | Manganaro | |
| 7,034,733 B2 | 4/2006 | Dedic et al. | |
| 7,355,449 B1 | 4/2008 | Tran et al. | |
| 7,432,741 B1 | 10/2008 | Shumarayev | |

OTHER PUBLICATIONS

U.S. Appl. No. 11/836,584, filed Aug. 9, 2007, Rezzi et al.
U.S. Appl. No. 11/836,619, filed Aug. 9, 2007, Rezzi et al.

(Continued)

*Primary Examiner*—James H. Cho
*Assistant Examiner*—Crystal L Hammond

(57) ABSTRACT

In a circuit to convert a first logic signal having a first range to a second logic signal having a second range, a first metal oxide semiconductor (MOS) transistor selectively couples an output node to a first reference voltage when the output node is to be in a first state. A second MOS transistor selectively discharges the output node toward a second reference voltage when the output node is to transition from the first state to a second state, the second state a logical complement of the first state. An output of a source-follower circuit, having a current source, is coupled to the output node. A third MOS transistor selectively couples the current source of the source-follower circuit to the second reference voltage when the output node is to be in the second state.

25 Claims, 7 Drawing Sheets

OTHER PUBLICATIONS

U.S. Appl. No. 11/836,628, filed Aug. 9, 2007, Rezzi et al.
U.S. Appl. No. 11/836,635, filed Aug. 9, 2007, Rezzi et al.
U.S. Appl. No. 11/846,292, filed Aug. 28, 2007, Rezzi et al.
Office Action in 11/836,619, dated Oct. 29, 2008.
Interview Summary in 11/836,619, dated Nov. 10, 2008.
Office Action in 11/836,635, dated Dec. 24, 2008.
Office Action for U.S. Appl. No. 11/836,635 dated May 21, 2009.
Notice of Allowance for U.S. Appl. No. 11/836,584.

* cited by examiner

CIRCUIT FOR CONVERTING A VOLTAGE RANGE OF A LOGIC SIGNAL

CROSS-REFERENCES TO RELATED APPLICATIONS

The present application claims the benefit of U.S. Provisional Application No. 60/821,899, entitled "DAC DRIVER WITH NMOS SOURCE FOLLOWER+DISCHARGING PMOS," filed on Aug. 9, 2006, which is hereby incorporated by reference herein in its entirety.

FIELD OF TECHNOLOGY

The present disclosure relates generally to digital circuits, and more particularly, to circuits for converting signals that vary in a first voltage range to signals that vary in a second voltage range.

DESCRIPTION OF THE RELATED ART

Typical current steering digital-to-analog converters (DACs) comprise a plurality of cells, each cell selectively supplying a current to a current summing line based on the digital value that is to be converted. The total current selectively supplied by all of the cells corresponds to the digital value, and different digital values will result in different amounts of total current.

For instance, FIG. 1 is a block diagram of an example current steering DAC 100 having a plurality of cells 104, 108, 112, and 116. Each of the cells 104, 108, 112, 116 includes an output coupled to a current summing line 120. Digital data that is to be converted may be supplied to each of the cells 104, 108, 112, 116. Each of the cells 104, 108, 112, 116 cells includes a current source and a switch that selectively, based on the digital data, applies current from the current source to the summing line 120. The total current on the summing line 120 will correspond to the digital value, and different digital values will result in different amounts of total current on the summing line 120.

FIG. 2 is a block diagram of an example cell 150 that may be utilized in the current steering DAC 100 of FIG. 1. The cell 150 includes a current source 154 and a switch comprising a p-channel metal oxide semiconductor (PMOS) transistor 158 and a PMOS transistor 162. A source of the transistor 158 is coupled to the current source 154, and a drain of the transistor 158 is coupled to the summing line 120. A source of the transistor 162 is coupled to the current source 154, and a drain of the transistor 158 is coupled to ground. The cell 150 also includes logic 166 that receives the digital data that is to be converted and generates a switch control signal based on the digital data. The switch control signal is coupled to a gate of the transistor 158 and is coupled to an input of an inverter 170. An output of the inverter 170 is coupled to a gate of the transistor 162.

In operation, the logic 166 will generate either a low signal (e.g., 0 volts) or a high signal (e.g., 1.2 volts) depending upon a value of the digital data. If a value of the digital data results in the logic 166 generating a low signal, the transistor 158 will be turned ON. Additionally, the inverter 170 will generate a high signal, and thus the transistor 162 will be turned OFF. This will result in the current source 154 being coupled to the summing line 120. Thus, the current source 154 will supply its current to the summing line 120. On the other hand, if a value of the digital data results in the logic 166 generating a high signal, the transistor 158 will be turned OFF. Additionally, the inverter 170 will generate a low signal, and thus the transistor 162 will be turned ON. This will result in the current source 154 being coupled to ground. Thus, the current source 154 will not supply any of its current to the summing line 120.

SUMMARY OF THE DISCLOSURE

In one embodiment, a circuit to convert a first logic signal having a first range to a second logic signal having a second range comprises a first transistor to selectively couple an output node to a first reference voltage when the output node is to be in a first state, and a second transistor to selectively discharge the output node toward a second reference voltage when the output node is to transition from the first state to a second state, the second state being a logical complement of the first state. The circuit also comprises a source-follower circuit having a source follower output coupled to the output node and having a current source. Additionally, the circuit comprises a third transistor to selectively couple the current source of the source-follower circuit to the second reference voltage when the output node is to be in the second state.

In another embodiment, a circuit to convert a first logic signal having a first range to a pair of complementary second logic signals having a second range, includes a first transistor to selectively couple a first output node to a first reference voltage when the first output node is to be in a first state, and a second transistor to selectively discharge the first output node toward a second reference voltage when the first output node is to transition from the first state to a second state, the second state a being logical complement of the first state. The circuit additionally includes a first source-follower circuit having a source follower output coupled to the first output node and having a current source. The circuit also includes a third transistor to selectively couple the current source of the first source follower circuit to the second reference voltage when the first output node is to be in the second state. Further, the circuit includes a fourth transistor to selectively couple a second output node to the first reference voltage when the second output node is to be in the first state, and a fifth transistor to selectively discharge the second output node toward the second reference voltage when the second output node is to transition from the first state to the second state. Still further, the circuit includes a second source-follower circuit having a source follower output coupled to the second output node and having a current source. Additionally, the circuit includes a sixth transistor to selectively couple the current source of the second source-follower circuit to the second reference voltage when the second output node is to be in the second state.

In yet another embodiment, a circuit to convert a first logic signal having a first range to at least one second logic signal having a second range comprises a first p-channel metal oxide semiconductor (PMOS) transistor having a gate coupled to a first control signal, a source coupled to a first reference voltage, and a drain coupled to a first output node. Additionally, the circuit comprises a second PMOS transistor having a gate coupled to a second control signal, the second control signal being a logical complement of the first control signal, the second PMOS transistor having a source coupled to the first output node and a drain coupled to a second reference voltage. Also, the circuit comprises a first n-channel metal oxide semiconductor (NMOS) transistor having a gate coupled to a first bias voltage, a source coupled to the first output node, and a drain coupled to the first reference voltage. Further, the circuit comprises a second NMOS transistor having a gate coupled to a second bias voltage and a drain coupled to the first output node. Still further, the circuit comprises a third NMOS transistor having a gate coupled to the first control signal, a source coupled to the second reference voltage, and a drain coupled to a source of the second NMOS transistor. A minimum voltage of the first output node when the first control signal is HIGH is within the range 100 millivolts and 350 millivolts, inclusive.

In still another embodiment, a cell of a current steering digital-to-analog converter (DAC) comprises a current source and a first p-channel metal oxide semiconductor (PMOS) transistor having a source coupled to the current source and a drain coupled to a current summing line. The cell of the current steering DAC also comprises a second PMOS transistor having a source coupled to the current source and a drain coupled to a reference node. Additionally, the cell of the current steering DAC comprises a driver circuit having an input, a first output coupled to a gate of the first PMOS transistor, and a second output coupled to a gate of the second PMOS transistor. The driver circuit includes a third PMOS transistor having a gate coupled to a first control signal, a source coupled to a first reference voltage, and a drain coupled to the first output of the driver circuit. Additionally, the driver circuit includes a fourth PMOS transistor having a gate coupled to a second control signal, the second control signal a being logical complement of the first control signal, the second PMOS transistor having a source coupled to the first output of the driver circuit and a drain coupled to a second reference voltage. Also, the driver circuit includes a first n-channel metal oxide semiconductor (NMOS) transistor having a gate coupled to a first bias voltage, a source coupled to the first output of the driver circuit, and a drain coupled to the first reference voltage. Further, the driver circuit includes a second NMOS transistor having a gate coupled to a second bias voltage and a drain coupled to the first output of the driver circuit. Still further, the driver circuit includes a third NMOS transistor having a gate coupled to the first control signal, a source coupled to the second reference voltage, and a drain coupled to a source of the second NMOS transistor. Additionally, the driver circuit includes a fifth PMOS transistor having a gate coupled to the second control signal, a source coupled to the first reference voltage, and a drain coupled to the second output of the driver circuit. Also, the driver circuit includes a sixth PMOS transistor having a gate coupled to the first control signal, a source coupled to the second output of the driver circuit, and a drain coupled to the second reference voltage. Further, the driver circuit includes a fourth NMOS transistor having a gate coupled to the first bias voltage, a source coupled to the second output of the driver circuit, and a drain coupled to the first reference voltage. Still further, the driver circuit includes a fifth NMOS transistor having a gate coupled to the second bias voltage and a drain coupled to the second output of the driver circuit. The driver circuit also includes a sixth NMOS transistor having a gate coupled to the second control signal, a source coupled to the second reference voltage, and a drain coupled to a source of the fifth NMOS transistor. A minimum voltage of the first output of the driver circuit when the first control signal is HIGH is within the range 100 millivolts to 350 millivolts, inclusive. A minimum voltage of the second output of the driver circuit when the first control signal is LOW is within the range 100 millivolts to 350 millivolts, inclusive.

DETAILED DESCRIPTION

Figure 1:
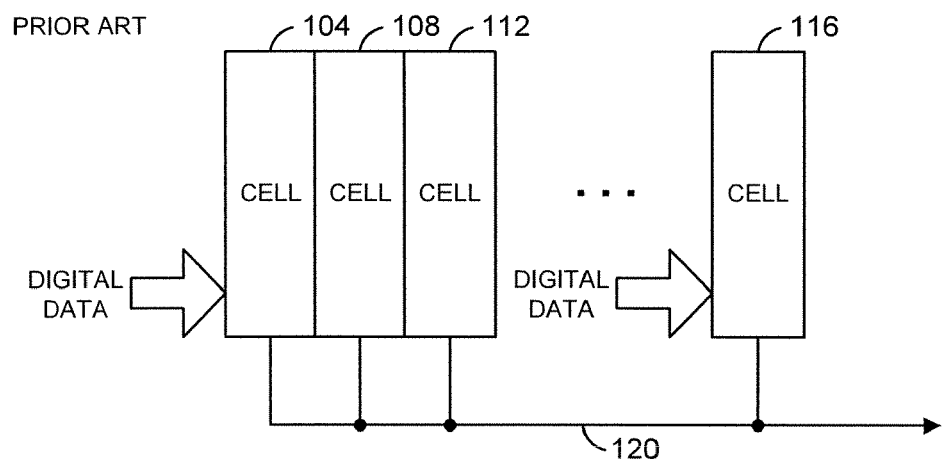
FIG. 1a block diagram of an example current steering digital-to-analog converter (DAC)
Figure 2:
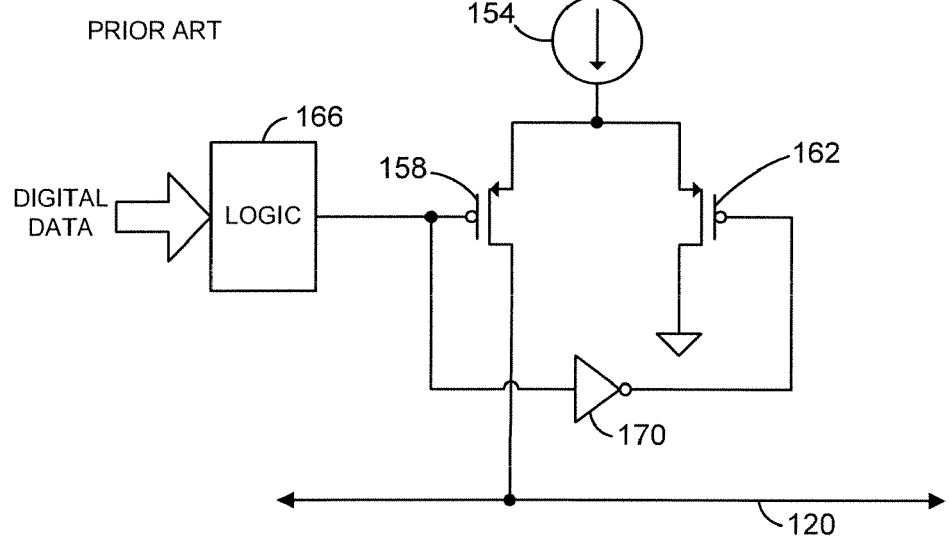
FIG. 2 is a circuit diagram of a cell of the current steering DAC of FIG. 1.
Figure 3:
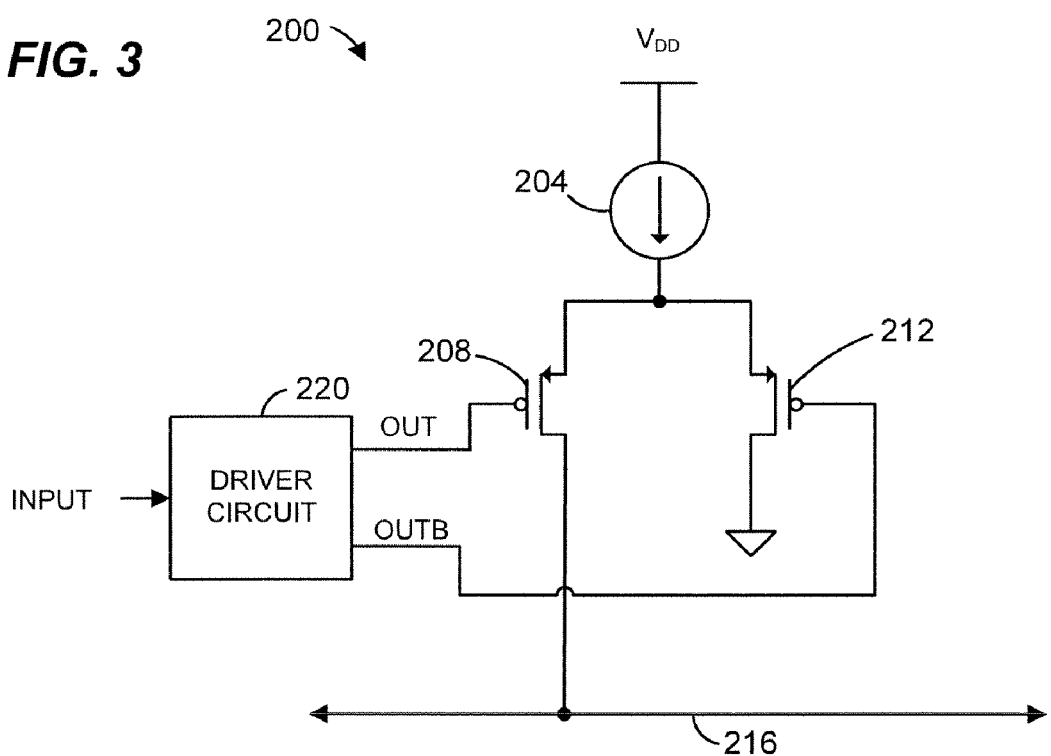
FIG. 3 is a circuit diagram of another cell that may be utilized in a current steering DAC.

FIG. 3 is a block diagram of an example cell 200 that may be utilized in a current steering DAC. The cell 200 includes a current source 204 and a switch comprising a p-channel metal oxide semiconductor (PMOS) transistor 208 and a PMOS transistor 212. A source of the transistor 208 is coupled to the current source 204, and a drain of the transistor 208 is coupled to a summing line 216. A source of the transistor 212 is coupled to the current source 204, and a drain of the transistor 212 is coupled to ground. The cell 200 also includes a driver circuit 220 that receives an input signal and generates two output signals based on the input signal. The input signal is indicative of whether the current source 204 should be coupled to or isolated from the summing line 216. The input signal may be generated by logic such as the logic block 166 of FIG. 2.

The two output signals control the transistors 208, 212 to selectively couple the current source 204 to the summing line 216. One of the output signals, OUT, is coupled to a gate of the transistor 208. The output signal, OUT B, is coupled to a gate of the transistor 212. The input signal coupled to the driving circuit 220 will vary between voltages levels for a typical CMOS device. For example, the input signal may vary between 0 volts and 1.2 volts. An input signal of approximately 0 volts may indicate that the current source 204 should be coupled to the summing line 216, and an input signal of approximately 1.2 volts may indicate that the current source 204 should be isolated from the summing line 216, for example. Alternatively, an input signal of approximately 1.2 volts may indicate that the current source 204 should be coupled to the summing line 216, and an input signal of approximately 0 volts may indicate that the current source 204 should be isolated from the summing line 216, for example.

The driving circuit 220 generates the output signals such that they vary in a range that is less than the range of that of the input signal. For example, if the input signal varies between approximately 0 volts and 1.2 volts, the output signals may vary between approximately 300 millivolts and 1.2 volts, for example, or some other range. It has been found that, in at least some implementations, using such a reduced range reduces charge injection associated with the transistors 208, 212. It also has been found that, in at least some implementations, using such a reduced range tends to keep the transistors 208, 212 biased in a desired region, such as in saturation.

In operation, when the input signal is HIGH (in the standard CMOS range), the driver circuit 220 will generate the signal OUT to be HIGH (in the reduced range) and will generate the signal OUTB to be LOW (in the reduced range). Similarly, when the input signal is LOW (in the standard CMOS range), the driver circuit 220 will generate the signal OUT to be LOW (in the reduced range) and will generate the signal OUTB to be HIGH (in the reduced range). As a specific example provided merely for explanatory purposes, if the input signal is 1.2 volts, the driver circuit 220 will generate the signal OUT to be 1.2 volts and will generate the signal OUTB to be 300 millivolts. Continuing with this example, if the input signal is 0 volts, the driver circuit 220 will generate the signal OUT to be 300 millivolts and will generate the signal OUTB to be 1.2 volts.

Figure 4:
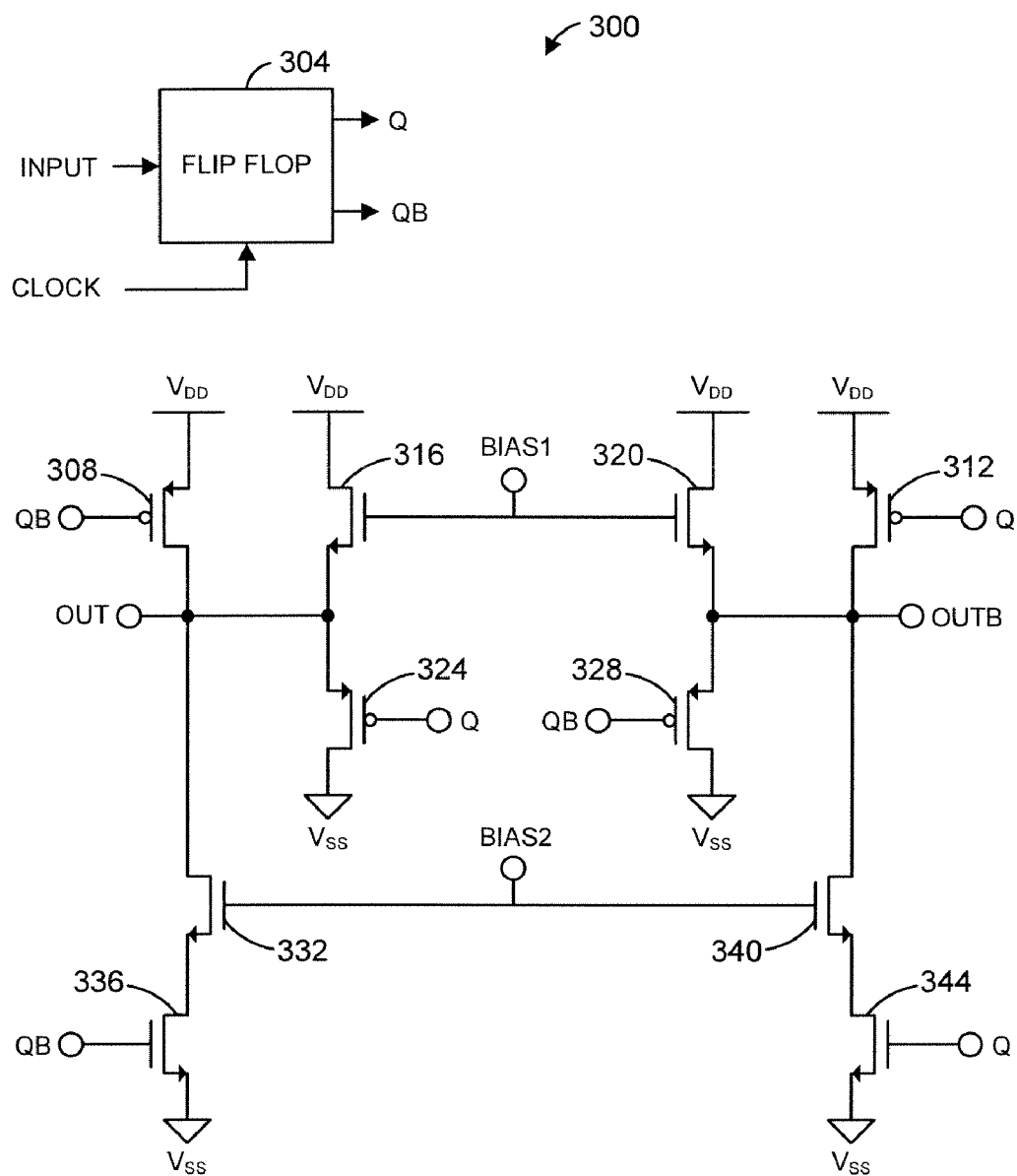
FIG. 4 is a circuit diagram of an example driver circuit that may be utilized in the cell of FIG. 3.

FIG. 4 is a circuit diagram of one example of a driving circuit 300 that may be used as the driving circuit 220 of FIG. 3. The driving circuit 300 includes a flip flop 304. The flip flop 304 includes a data input coupled to the input signal and a clock input coupled to a clock signal. The clock signal may be a clock signal of a DAC for example. The flip flop 304 generates a Q signal and a QB signal. The Q signal corresponds to the input signal, and the QB signal corresponds to a logical complement of the input signal.

The driving circuit 300 also includes a PMOS transistor 308 having a source coupled to a reference voltage $V_{DD}$, a drain coupled to a node OUT, and a gate coupled to the QB signal. The reference voltage $V_{DD}$ may be 1.2 volts, for example, or any other suitable reference voltage. A PMOS transistor 312 has a source coupled to $V_{DD}$, a drain coupled to a node OUTB, and a gate coupled to the Q signal. An n-channel metal oxide semiconductor (NMOS) transistor 316 has a drain coupled to $V_{DD}$, a source coupled to the OUT node, and a gate coupled to a bias signal BIAS1. An NMOS transistor 320 has a drain coupled to $V_{DD}$, a source coupled to the OUTB node, and a gate coupled to BIAS1.

The driving circuit 300 further includes a PMOS transistor 324 having a source coupled to the OUT node, a drain coupled to a reference voltage $V_{SS}$, and a gate coupled to the Q signal. The reference voltage $V_{SS}$ may be ground, for example, or any other suitable reference voltage. A PMOS transistor 328 has a source coupled to the OUTB node, a drain coupled to $V_{SS}$, and a gate coupled to the QB signal.

An NMOS transistor 332 has a drain coupled to the OUT node and a gate coupled to a bias signal BIAS2. An NMOS transistor 336 has a drain coupled to a source of the transistor 332, a source coupled to $V_{SS}$, and a gate coupled to the QB signal. An NMOS transistor 340 has a drain coupled to the OUTB node and a gate coupled to BIAS2. An NMOS transistor 344 has a drain coupled to a source of the transistor 340, a source coupled to $V_{SS}$, and a gate coupled to the Q signal.

Operation of the driving circuit 300 will now be described. First, assume that the input signal is HIGH, the Q signal is HIGH, and the QB signal is LOW. In this state, the transistor 308 is ON, and the transistor 336 is OFF. Also, the transistor 324 is OFF. Thus, the node OUT is approximately $V_{DD}$. Additionally, the transistor 312 is OFF, and the transistor 344 is ON. Further, the transistor 328 is OFF. As will be described in more detail below, the node OUTB is some desired voltage above $V_{SS}$, and this voltage will be referred to as $V_{MIN}$.

Now, if the input signal transitions to LOW, the Q signal will transition to LOW and the QB signal will transition to HIGH in response to a clock event such as a rising edge. Thus, the transistor 308 will turn OFF and the transistor 336 will turn ON. Also, the transistor 324 will turn ON. This will cause the OUT node to discharge toward $V_{SS}$ via the transistor 324, thus helping to speed the transition of the OUT node. As the voltage at the OUT node falls, the transistor 324 will eventually turn OFF.

The transistor 316 and the transistor 332 act as a source-follower circuit, wherein the transistor 332 is a current source for the source-follower circuit. The bias voltage BIAS2 affects how much current flows through the transistor 316 when QB is HIGH, and thus affects the gate-to-source voltage ($V_{GS}$) of the transistor 316 when QB is HIGH. The eventual voltage of the node OUT will be the voltage of BIAS1 minus $V_{GS}$ of the transistor 316. The node OUT can be made to fall to the desired voltage $V_{MIN}$ by appropriately selecting BIAS1 in light of a known value of $V_{GS}$ of the transistor 316 when QB is HIGH. For example, BIAS1 could be set as $V_{MIN}+V_{GS}$. In one specific implementation, the voltage $V_{MIN}$ may be approximately 300 millivolts. It is to be understood, however, that other values of $V_{MIN}$ may be utilized as well. For example, the voltage $V_{MIN}$ may be approximately 100 millivolts, 125 millivolts, 150 millivolts, 175 millivolts, 200 millivolts, 225 millivolts, 250 millivolts, 275 millivolts, 325 millivolts, 350 millivolts, etc. Thus, the voltages BIAS1 and BIAS2 can be selected to provide a desired value of $V_{MIN}$.

With regard to the node OUTB, the transistor 312 turns ON, and the transistor 344 turns OFF. Also, the transistor 328 is OFF. Thus, the node OUTB will be pulled to approximately $V_{DD}$.

Now, if the input signal transitions to HIGH, the Q signal will transition to HIGH and the QB signal will transition to LOW in response to a clock event such as a rising edge. Thus, the transistor 312 will turn OFF and the transistor 344 will turn ON. Also, the transistor 328 will turn ON. This will cause the OUTB node to discharge toward $V_{SS}$ via the transistor 328, thus helping to speed the transition of the OUTB node. As the voltage of the node OUTB falls, the transistor 328 will eventually turn OFF.

The transistor 320 and the transistor 340 act as a source-follower circuit, wherein the transistor 340 is a current source for the source-follower circuit. Thus, the eventual voltage of the node OUTB the voltage of BIAS1 minus $V_{GS}$ of the transistor 320. Further to the discussion above with respect to making the node OUT fall to the desired voltage $V_{MIN}$, the node OUTB also can be made to fall to the desired voltage $V_{MIN}$ by appropriately selecting BIAS1 in light of a known value of $V_{GS}$ of the transistor 320 (e.g., BIAS1=$V_{MIN}+V_{GS}$). The bias voltage BIAS2 affects how much current flows through the transistor 320 when Q is HIGH, and thus affects the gate-to-source voltage ($V_{GS}$) of the transistor 320 when Q is HIGH. In other words, the voltages BIAS1 and BIAS2 can be selected to provide a desired value of $V_{MIN}$.

With regard to the node OUT, the transistor 308 turns ON, and the transistor 336 turns OFF. Also, the transistor 324 is OFF. Thus, the node OUT will be pulled to approximately $V_{DD}$.

One of ordinary skill in the art will recognize many variations to the example circuit 300 are possible. For example, if a complement output is not needed, one half of the circuit 300 may be omitted. In particular, the transistors 312, 320, 328, 340, and 344 could be omitted. As another example, the flip-flop 304 may be omitted. For instance, the input signal could be coupled to the gates of the transistors 312, 324, and 344. Also, the circuit could include an inverter having an input coupled to the input signal and an output coupled to the gates of the transistors 308, 328, and 336. One or ordinary skill in the art will recognize many other variations.

A circuit such as described above may be utilized in a variety of devices that require the conversion of a logic signal into a signal having a reduced range. As just one example, such a circuit may be utilized in current steering DACs. More generally, such a circuit may be utilized in a variety of electronic devices such as communication devices, computation devices, storage devices, networking devices, measurement devices, etc. Referring now to FIGS. 5A-5H, a few specific examples of devices that may utilize a circuit such as such as the circuit 300 will be described.

Figure 5A:
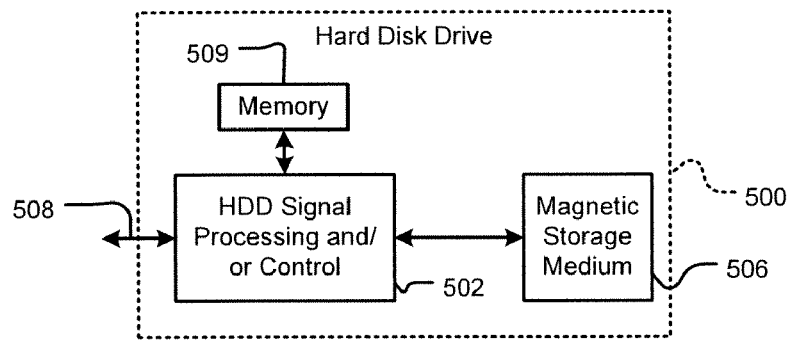
FIG. 5A is a block diagram of a hard disk drive system that may utilize a circuit such as the circuit of FIG. 4.

For example, referring to FIG. 5A, a hard disk drive 500 may include a circuit such as the circuit 300. For example, signal processing and/or control circuits, which are generally identified in FIG. 5A at 502, may include a circuit such as the circuit 300. For instance, signal processing and/or control circuits 502 may include one or more current steering DACs. In some implementations, signal processing and/or control circuit 502 and/or other circuits (not shown) in HDD 500 may process data, perform coding and/or encryption, perform calculations, and/or format data that is output to and/or received from a magnetic storage medium 506.

HDD 500 may communicate with a host device (not shown) such as a computer, mobile computing devices such as personal digital assistants, cellular phones, media or MP3 players and the like, and/or other devices via one or more wired or wireless communication links 508. HDD 500 may be connected to memory 509, such as random access memory (RAM), a low latency nonvolatile memory such as flash memory, read only memory (ROM) and/or other suitable electronic data storage.

Figure 5B:
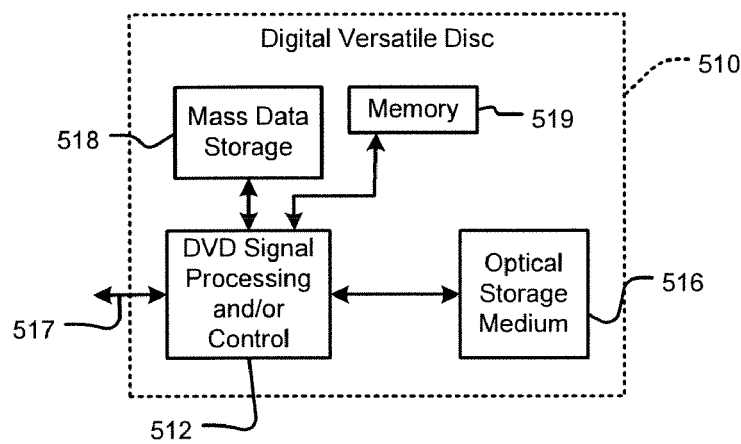
FIG. 5B is a block diagram of a digital versatile drive system that may utilize a circuit such as the circuit of FIG. 4.

Referring now to FIG. 5B, a circuit such as the circuit 300 may be utilized in a digital versatile disc (DVD) drive 510. A circuit such as the circuit 300 may be utilized in either or both signal processing and/or control circuits, which are generally identified in FIG. 5B at 512, and/or mass data storage 518 of DVD drive 510. For instance, signal processing and/or control circuits 512 and/or the mass storage device 518 may include one or more current steering DACs. Signal processing and/or control circuit 512 and/or other circuits (not shown) in DVD 510 may process data, perform coding and/or encryption, perform calculations, and/or format data that is read from and/or data written to an optical storage medium 516. In some implementations, signal processing and/or control circuit 512 and/or other circuits (not shown) in DVD 510 can also perform other functions such as encoding and/or decoding and/or any other signal processing functions associated with a DVD drive.

DVD drive 510 may communicate with an output device (not shown) such as a computer, television or other device via one or more wired or wireless communication links 517. DVD 510 may communicate with mass data storage 518 that stores data in a nonvolatile manner. Mass data storage 518 may include a hard disk drive (HDD) such as that shown in FIG. 5B. The HDD may be a mini HDD that includes one or more platters having a diameter that is smaller than approximately 1.8". DVD 510 may be connected to memory 519, such as RAM, ROM, low latency nonvolatile memory such as flash memory, and/or other suitable electronic data storage.

Figure 5C:
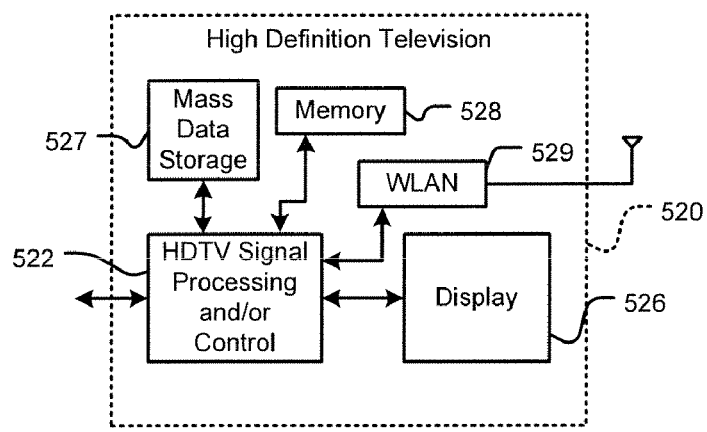
FIG. 5C is a block diagram of a high definition television that may utilize a circuit such as the circuit of FIG. 4.

Referring to FIG. 5C, a circuit such as the circuit 300 may be utilized in a high definition television (HDTV) 520. The HDTV 520 includes signal processing and/or control circuits, which are generally identified in FIG. 5C at 522, a WLAN interface 529, and a mass data storage 527. A circuit such as the circuit 300 may be utilized in the WLAN interface 529 or the signal processing circuit and/or control circuit 522, for example. For instance, the WLAN interface 529 and/or signal processing and/or control circuits 522 may include one or more current steering DACs. HDTV 520 receives HDTV input signals in either a wired or wireless format and generates HDTV output signals for a display 526. In some implementations, signal processing circuit and/or control circuit 522 and/or other circuits (not shown) of HDTV 520 may process data, perform coding and/or encryption, perform calculations, format data and/or perform any other type of HDTV processing that may be required.

HDTV 520 may communicate with mass data storage 527 that stores data in a nonvolatile manner such as optical and/or magnetic storage devices. The mass data storage 527 may include one or more hard disk drives (HDDs) and/or one or more digital versatile disks (DVDs). At least one HDD may have the configuration shown in FIG. 5A and/or at least one DVD may have the configuration shown in FIG. 5B. One or more of the HDDs may be a mini HDD that includes one or more platters having a diameter that is smaller than approximately 1.8". HDTV 520 may be connected to memory 528 such as RAM, ROM, low latency nonvolatile memory such as flash memory and/or other suitable electronic data storage. HDTV 520 also may support connections with a WLAN via a WLAN network interface 529.

Figure 5D:
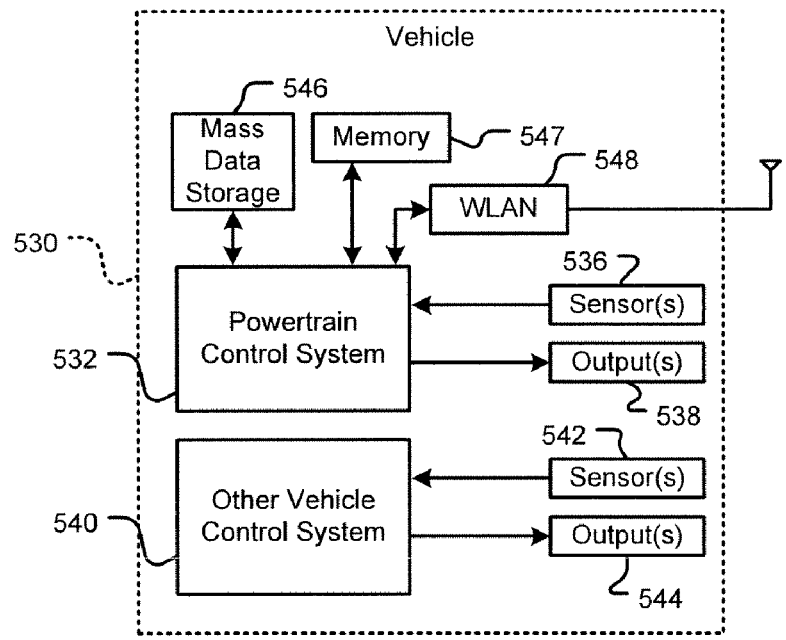
FIG. 5D is a block diagram of a vehicle that may utilize a circuit such as the circuit of FIG. 4.

Referring now to FIG. 5D, a circuit such as the circuit 300 may be utilized in a control system of a vehicle 530. In some implementations, a circuit such as the circuit 300 may be utilized by a powertrain control system 532 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals. For instance, the powertrain control system 532 may include one or more current steering DACs.

A circuit such as the circuit 300 may be utilized in other control systems 540 of vehicle 530. For instance, control systems 540 may include one or more current steering DACs. Control system 540 may likewise receive signals from input sensors 542 and/or output control signals to one or more output devices 544. In some implementations, control system 540 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 532 may communicate with mass data storage 546 that stores data in a nonvolatile manner. Mass data storage 546 may include optical and/or magnetic storage devices for example hard disk drives HDD and/or DVDs. At least one HDD may have the configuration shown in FIG. 5A and/or at least one DVD may have the configuration shown in FIG. 5B. One or more of the HDDs may be a mini HDD that includes one or more platters having a diameter that is smaller than approximately 1.8". Powertrain control system 532 may be connected to memory 547 such as RAM, ROM, low latency nonvolatile memory such as flash memory and/or other suitable electronic data storage. Powertrain control system 532 also may support connections with a WLAN via a WLAN network interface 548. The WLAN interface 548 may include a circuit such as the circuit 300. For instance, the WLAN interface 548 may include one or more current steering DACs. The control system 540 may also include mass data storage, memory and/or a WLAN interface (all not shown).

Figure 5E:
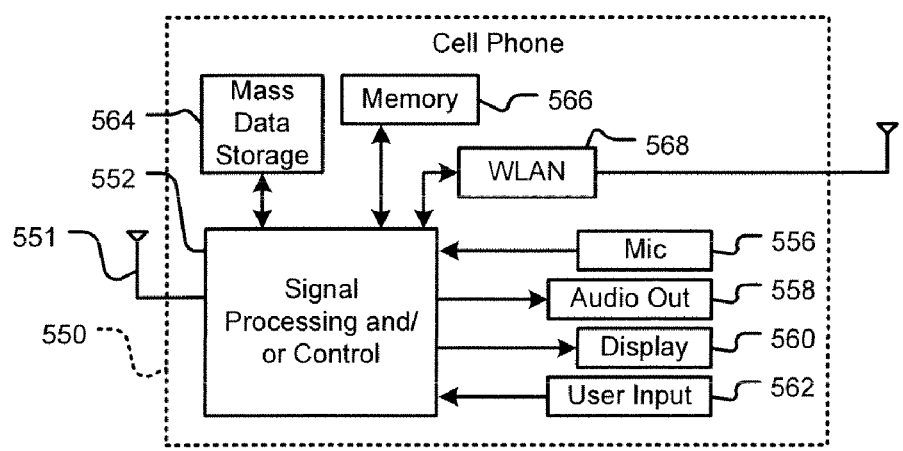
FIG. 5E is a block diagram of a cellular phone that may utilize a circuit such as the circuit of FIG. 4.

Referring now to FIG. 5E, a circuit such as the circuit 300 may be utilized in a cellular phone 550 that may include a cellular antenna 551. The cellular phone 550 includes signal processing and/or control circuits, which are generally identified in FIG. 5E at 552, a WLAN interface 568, and a mass data storage 564. A circuit such as the circuit 300 may be utilized in the signal processing and/or control circuits 552 and/or the WLAN interface 568, for example. For instance, the signal processing and/or control circuits and/or the WLAN interface 568 may include one or more current steering DACs. In some implementations, cellular phone 550 includes a microphone 556, an audio output 558 such as a speaker and/or audio output jack, a display 560 and/or an input device 562 such as a keypad, pointing device, voice actuation and/or other input device. Signal processing and/or control circuits 552 and/or other circuits (not shown) in cellular phone 550 may process data, perform coding and/or encryption, perform calculations, format data and/or perform other cellular phone functions.

Cellular phone 550 may communicate with mass data storage 564 that stores data in a nonvolatile manner such as optical and/or magnetic storage devices for example hard disk drives HDD and/or DVDs. At least one HDD may have the configuration shown in FIG. 5A and/or at least one DVD may have the configuration shown in FIG. 5B. At least one HDD may be a mini HDD that includes one or more platters having a diameter that is smaller than approximately 1.8". Cellular phone 550 may be connected to memory 566 such as RAM, ROM, low latency nonvolatile memory such as flash memory and/or other suitable electronic data storage. Cellular phone 550 also may support connections with a WLAN via a WLAN network interface 568.

Figure 5F:
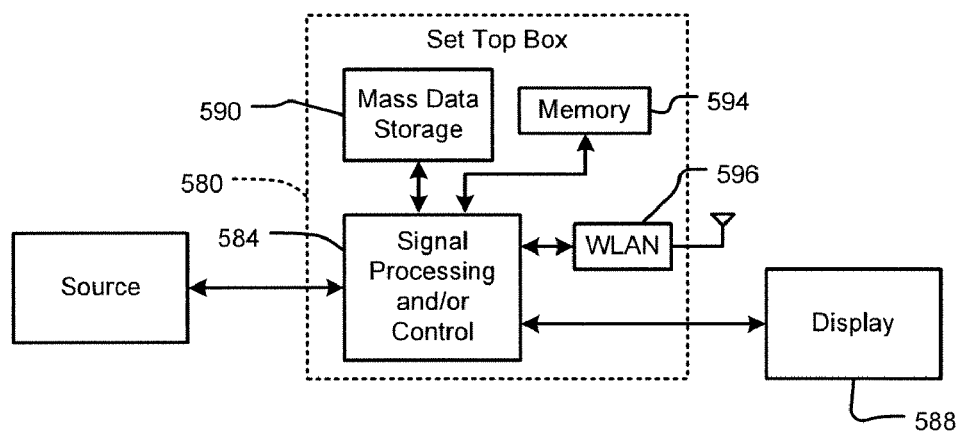
FIG. 5F is a block diagram of a set top box that may utilize a circuit such as the circuit of FIG. 4.

Referring now to FIG. 5F, a circuit such as the circuit 300 may be utilized in a set top box 580. The set top box 580 includes signal processing and/or control circuits, which are generally identified in FIG. 5F at 584, a WLAN interface 596, and a mass data storage device 590. A circuit such as the circuit 300 may be utilized in the signal processing and/or control circuits 584 and/or the WLAN interface 596, for example. For instance, the signal processing and/or control circuits 584 and/or the WLAN interface 596 may include one or more current steering DACs. Set top box 580 receives signals from a source such as a broadband source and outputs standard and/or high definition audio/video signals suitable for a display 588 such as a television and/or monitor and/or other video and/or audio output devices. Signal processing and/or control circuits 584 and/or other circuits (not shown) of the set ton box 580 may process data, perform coding and/or encryption, perform calculations, format data and/or perform any other set top box function.

Set top box 580 may communicate with mass data storage 590 that stores data in a nonvolatile manner. Mass data storage 590 may include optical and/or magnetic storage devices for example hard disk drives HDD and/or DVDs. At least one HDD may have the configuration shown in FIG. 5A and/or at least one DVD may have the configuration shown in FIG. 5B. At least one HDD may be a mini HDD that includes one or more platters having a diameter that is smaller than approximately 1.8". Set top box 580 may be connected to memory 594 such as RAM, ROM, low latency nonvolatile memory such as flash memory and/or other suitable electronic data storage. Set top box 580 also may support connections with a WLAN via a WLAN network interface 596.

Figure 5G:
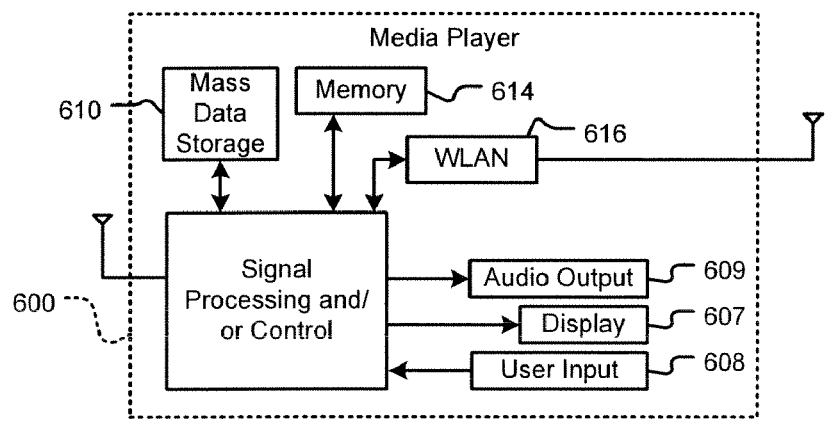
FIG. 5G is a block diagram of a media player that may utilize a circuit such as the circuit of FIG. 4.

Referring now to FIG. 5G, a circuit such as the circuit 300 may be utilized in a media player 600. The media player 600 may include signal processing and/or control circuits, which are generally identified in FIG. 5G at 604, a WLAN interface 616, and a mass data storage device 610. A circuit such as the circuit 300 may be utilized in the signal processing and/or control circuits 604 and/or the WLAN interface 616, for example. For instance, the signal processing and/or control circuits 604 and/or the WLAN interface 616 may include one or more current steering DACs. In some implementations, media player 600 includes a display 607 and/or a user input 608 such as a keypad, touchpad and the like. In some implementations, media player 600 may employ a graphical user interface (GUI) that typically employs menus, drop down menus, icons and/or a point-and-click interface via display 607 and/or user input 608. Media player 600 further includes an audio output 609 such as a speaker and/or audio output jack. Signal processing and/or control circuits 604 and/or other circuits (not shown) of media player 600 may process data, perform coding and/or encryption, perform calculations, format data and/or perform any other media player function.

Media player 600 may communicate with mass data storage 610 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 5A and/or at least one DVD may have the configuration shown in FIG. 5B. At least one HDD may be a mini HDD that includes one or more platters having a diameter that is smaller than approximately 1.8". Media player 600 may be connected to memory 614 such as RAM, ROM, low latency nonvolatile memory such as flash memory and/or other suitable electronic data storage. Media player 600 also may support connections with a WLAN via a WLAN network interface 616. Still other implementations in addition to those described above are contemplated.

Figure 5H:
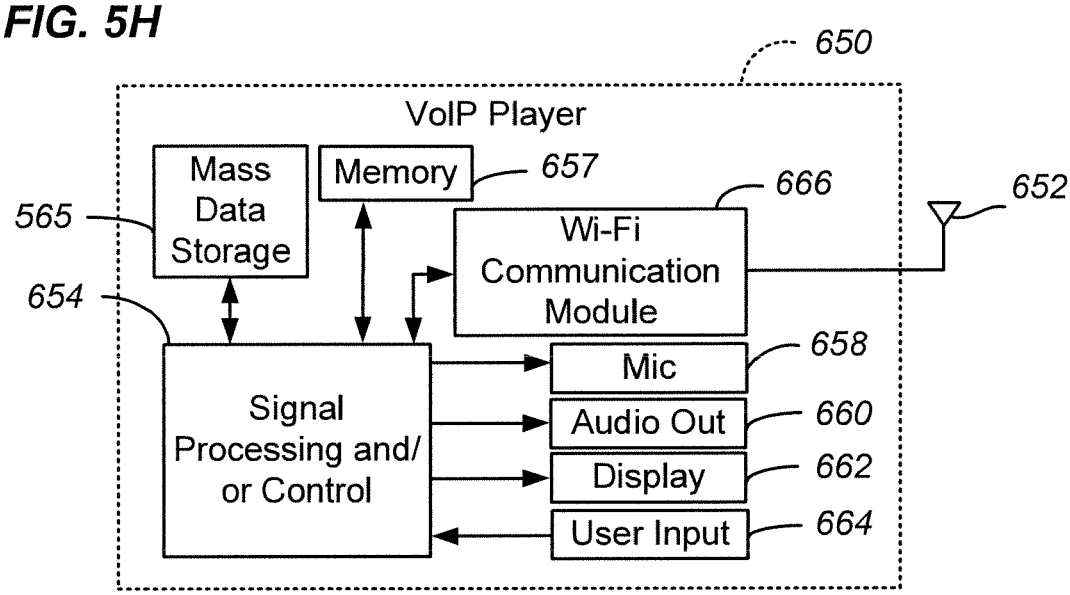
FIG. 5H is a block diagram of a voice over IP device that may utilize a circuit such as the circuit of FIG. 4.

Referring to FIG. 5H, a circuit such as the circuit 300 may be utilized in a Voice over Internet Protocol (VoIP) phone 650 that may include an antenna 654, signal processing and/or control circuits 658, a wireless interface 662, and a mass data storage 666. A circuit such as the circuit 300 may be utilized in the signal processing and/or control circuits 658 and/or the wireless interface 662, for example. For instance, the signal processing and/or control circuits 658 and/or the wireless interface 662 may include one or more current steering DACs. In some implementations, VoIP phone 650 includes, in part, a microphone 670, an audio output 674 such as a speaker and/or audio output jack, a display monitor 678, an input device 682 such as a keypad, pointing device, voice actuation and/or other input devices, and a Wireless Fidelity (Wi-Fi) communication module 662. Signal processing and/or control circuits 658 and/or other circuits (not shown) in VoIP phone 650 may process data, perform coding and/or encryption, perform calculations, format data and/or perform other VoIP phone functions.

VoIP phone 650 may communicate with mass data storage 666 that stores data in a nonvolatile manner such as optical and/or magnetic storage devices, for example hard disk drives HDD and/or DVDs. At least one HDD may have the configuration shown in FIG. 5A and/or at least one DVD may have the configuration shown in FIG. 5B. The HDD may be a mini HDD that includes one or more platters having a diameter that is smaller than approximately 1.8". VoIP phone 650 may be connected to memory 686, which may be a RAM, ROM, low latency nonvolatile memory such as flash memory and/or other suitable electronic data storage. VoIP phone 650 is configured to establish communications link with a VoIP network (not shown) via Wi-Fi communication module 662.

While the present invention has been described with reference to specific examples, which are intended to be illustrative only and not to be limiting of the invention, it will be apparent to those of ordinary skill in the art that changes, additions or deletions in addition to those explicitly described above may be made to the disclosed embodiments without departing from the spirit and scope of the invention.

What is claimed is:

1. A circuit to convert a first logic signal having a first range to a second logic signal having a second range, comprising:
   a first transistor to selectively couple an output node to a first reference voltage when the output node is to be in a first state;
   a second transistor to selectively discharge the output node toward a second reference voltage when the output node is to transition from the first state to a second state, the second state being a logical complement of the first state;
   a source-follower circuit having a source follower output coupled to the output node and having a current source; and
   a third transistor to selectively couple the current source of the source-follower circuit to the second reference voltage when the output node is to be in the second state.

2. A circuit according to claim 1, wherein a gate of the first transistor is coupled to a first control signal;
   wherein a gate of the second transistor is coupled to a second control signal, the second control signal being a logical complement of the first control signal;
   wherein a gate of the third transistor is coupled to the first control signal.

3. A circuit according to claim 2, further comprising a flip-flop having an input, a first output, and a second output, the second output being a complement of the first output;
   wherein the first logic signal is coupled to the input of the flip-flop;
   wherein the first output of the flip-flop is coupled to the gate of the second transistor;
   wherein the second output of the flip-flop is coupled to the gate of the first transistor;
   wherein the second output of the flip-flop is coupled to the gate of the third transistor.

4. A circuit according to claim 2, further comprising an inverter having an input coupled to the first logic signal and an output;
   wherein the first logic signal is coupled to the gate of the second transistor;
   wherein the output of the inverter is coupled to the gate of the first transistor;
   wherein the output of the inverter is coupled to the gate of the third transistor.

5. A circuit according to claim 1, wherein the source-follower circuit comprises a fourth transistor having a source coupled to the output node, a drain coupled to the first reference voltage, and a gate coupled to a first bias voltage;
   wherein the current source of the source-follower circuit comprises a fifth transistor having a drain coupled to the output node, a source coupled to the third transistor, and a gate coupled to a second bias voltage.

6. A circuit according to claim 5, wherein a source of the first transistor is coupled to the first reference voltage, and a drain of the first transistor is coupled to the output node;
   wherein a source of the second transistor is coupled to the output node, and a drain of the second transistor is coupled to the second reference voltage;
   wherein a source of the third transistor is coupled to the second reference voltage, and a drain of the third transistor is coupled to the source of the fifth transistor.

7. A circuit according to claim 6, wherein the first transistor is a p-channel MOS (PMOS) transistor;
   wherein the second transistor is a PMOS transistor;
   wherein the third transistor is an n-channel MOS (NMOS) transistor;
   wherein the fourth transistor is an NMOS transistor; and
   wherein the fifth transistor is an NMOS transistor.

8. A circuit according to claim 7, wherein a gate of the first transistor is coupled to a first control signal;
   wherein a gate of the second transistor is coupled to a second control signal, the second control signal being a logical complement of the first control signal;
   wherein a gate of the third transistor is coupled to the first control signal.

9. A circuit according to claim 1, wherein the source-follower circuit keeps a voltage of the output node in the second state in an approximate range of 100 millivolts to 350 millivolts.

10. A circuit to convert a first logic signal having a first range to a pair of complementary second logic signals having a second range, comprising:
    a first transistor to selectively couple a first output node to a first reference voltage when the first output node is to be in a first state;
    a second transistor to selectively discharge the first output node toward a second reference voltage when the first output node is to transition from the first state to a second state, the second state being a logical complement of the first state;
    a first source-follower circuit having a source follower output coupled to the first output node and having a current source; and
    a third transistor to selectively couple the current source of the first source-follower circuit to the second reference voltage when the first output node is to be in the second state;
    a fourth transistor to selectively couple a second output node to the first reference voltage when the second output node is to be in the first state;
    a fifth transistor to selectively discharge the second output node toward the second reference voltage when the second output node is to transition from the first state to the second state;
    a second source-follower circuit having a source follower output coupled to the second output node and having a current source; and
    a sixth transistor to selectively couple the current source of the second source-follower circuit to the second reference voltage when the second output node is to be in the second state.

11. A circuit according to claim 10, wherein a gate of the first transistor is coupled to a first control signal;
    wherein a gate of the second transistor is coupled to a second control signal, the second control signal being a logical complement of the first control signal;
    wherein a gate of the third transistor is coupled to the first control signal;
    wherein a gate of the fourth transistor is coupled to the second control signal;
    wherein a gate of the fifth transistor is coupled to the first control signal;
    wherein a gate of the sixth transistor is coupled to the second control signal.

12. A circuit according to claim 11, further comprising a flip-flop having an input, a first output, and a second output, the second output being a complement of the first output;
    wherein the first logic signal is coupled to the input of the flip-flop;
    wherein the first output of the flip-flop is coupled to the gate of the second transistor;

wherein the second output of the flip-flop is coupled to the gate of the first transistor;
wherein the second output of the flip-flop is coupled to the gate of the third transistor;
wherein the second output of the flip-flop is coupled to the gate of the fifth transistor;
wherein the first output of the flip-flop is coupled to the gate of the fourth transistor;
wherein the first output of the flip-flop is coupled to the gate of the sixth transistor.

13. A circuit according to claim 11, further comprising an inverter having an input coupled to the first logic signal and an output;
wherein the first logic signal is coupled to the gate of the second transistor;
wherein the output of the inverter is coupled to the gate of the first transistor;
wherein the output of the inverter is coupled to the gate of the third transistor;
wherein the output of the inverter is coupled to the gate of the fifth transistor;
wherein the first logic signal is coupled to the gate of the fourth transistor;
wherein the first logic signal is coupled to the gate of the sixth transistor.

14. A circuit according to claim 10, wherein the first source-follower circuit comprises a seventh transistor having a source coupled to the first output node, a drain coupled to the first reference voltage, and a gate coupled to a first bias voltage;
wherein the current source of the first source-follower circuit comprises an eighth transistor having a drain coupled to the first output node, a source coupled to the third transistor, and a gate coupled to a second bias voltage;
wherein the second source-follower circuit comprises a ninth transistor having a source coupled to the second output node, a drain coupled to the first reference voltage, and a gate coupled to the first bias voltage;
wherein the current source of the second source-follower circuit comprises a tenth transistor having a drain coupled to the second output node, a source coupled to the sixth transistor, and a gate coupled to the second bias voltage.

15. A circuit according to claim 14, wherein a source of the first transistor is coupled to the first reference voltage, and a drain of the first transistor is coupled to the first output node;
wherein a source of the second transistor is coupled to the first output node, and a drain of the second transistor is coupled to the second reference voltage;
wherein a source of the third transistor is coupled to the second reference voltage, and a drain of the third transistor is coupled to the source of the eighth transistor.

16. A circuit according to claim 15, wherein the first transistor is a p-channel MOS (PMOS) transistor;
wherein the second transistor is a PMOS transistor;
wherein the third transistor is an n-channel MOS (NMOS) transistor;
wherein the fourth transistor is a PMOS transistor;
wherein the fifth transistor is a PMOS transistor;
wherein the sixth transistor is an NMOS transistor;
wherein the seventh transistor is an NMOS transistor;
wherein the eighth transistor is an NMOS transistor;
wherein the ninth transistor is an NMOS transistor;
wherein the tenth transistor is an NMOS transistor.

17. A circuit according to claim 16, wherein a gate of the first transistor is coupled to a first control signal;
wherein a gate of the second transistor is coupled to a second control signal, the second control signal being a logical complement of the first control signal;
wherein a gate of the third transistor is coupled to the first control signal;
wherein a gate of the fourth transistor is coupled to the second control signal;
wherein a gate of the fifth transistor is coupled to the first control signal;
wherein a gate of the sixth transistor is coupled to the second control signal.

18. A circuit according to claim 10, wherein the first source-follower circuit keeps a voltage of the first output node in the second state in an approximate range of 100 millivolts to 350 millivolts; and
wherein the second source-follower circuit keeps a voltage of the second output node in the second state in an approximate range of 100 millivolts to 350 millivolts.

19. A circuit to convert a first logic signal having a first range to at least one second logic signal having a second range, comprising:
a first p-channel metal oxide semiconductor (PMOS) transistor having a gate coupled to a first control signal, a source coupled to a first reference voltage, and a drain coupled to a first output node;
a second PMOS transistor having a gate coupled to a second control signal, the second control signal a logical complement of the first control signal, the second PMOS transistor having a source coupled to the first output node and a drain coupled to a second reference voltage;
a first n-channel metal oxide semiconductor (NMOS) transistor having a gate coupled to a first bias voltage, a source coupled to the first output node, and a drain coupled to the first reference voltage;
a second NMOS transistor having a gate coupled to a second bias voltage and a drain coupled to the first output node;
a third NMOS transistor having a gate coupled to the first control signal, a source coupled to the second reference voltage, and a drain coupled to a source of the second NMOS transistor;
wherein a minimum voltage of the first output node when the first control signal is HIGH is within the range 100 millivolts and 350 millivolts, inclusive.

20. A circuit according to claim 19, wherein the circuit is to convert the first logic signal to a pair of complementary second logic signals having the second range, the circuit further comprising:
a third PMOS transistor having a gate coupled to the second control signal, a source coupled to the first reference voltage, and a drain coupled to a second output node;
a fourth PMOS transistor having a gate coupled to the first control signal, a source coupled to the second output node, and a drain coupled to the second reference voltage;
a fourth NMOS transistor having a gate coupled to the first bias voltage, a source coupled to the second output node, and a drain coupled to the first reference voltage;
a fifth NMOS transistor having a gate coupled to the second bias voltage and a drain coupled to the second output node;
a sixth NMOS transistor having a gate coupled to the second control signal, a source coupled to the second reference voltage, and a drain coupled to a source of the fifth NMOS transistor;

wherein a minimum voltage of the second output node when the first control signal is LOW is within the range 100 millivolts to 350 millivolts, inclusive.

21. A circuit according to claim 20, further comprising a flip-flop having an input, a first output, and a second output, the second output a complement of the first output;
   wherein the first logic signal is coupled to the input of the flip-flop;
   wherein the first output of the flip-flop is coupled to the gate of the second PMOS transistor, the gate of the sixth NMOS transistor, and the gate of the third PMOS transistor;
   wherein the second output of the flip-flop is coupled to the gate of the first PMOS transistor, the gate of the third NMOS transistor, and the gate of the fourth PMOS transistor.

22. A circuit according to claim 19, further comprising an inverter having an input coupled to the first logic signal and an output;
   wherein the first logic signal is coupled to the gate of the second PMOS transistor, the gate of the sixth NMOS transistor, and the gate of the third PMOS transistor;
   wherein the output of the inverter is coupled to the gate of the first PMOS transistor, the gate of the third NMOS transistor, and the gate of the fourth PMOS transistor.

23. A cell of a current steering digital-to-analog converter, comprising:
   a current source;
   a first p-channel metal oxide semiconductor (PMOS) transistor having a source coupled to the current source and a drain coupled to a current summing line;
   a second PMOS transistor having a source coupled to the current source and a drain coupled to a reference node;
   a driver circuit having an input, a first output coupled to a gate of the first PMOS transistor, and a second output coupled to a gate of the second PMOS transistor;
   wherein the driver circuit comprises:
   a third PMOS transistor having a gate coupled to a first control signal, a source coupled to a first reference voltage, and a drain coupled to the first output of the driver circuit;
   a fourth PMOS transistor having a gate coupled to a second control signal, the second control signal being a logical complement of the first control signal, the fourth PMOS transistor having a source coupled to the first output of the driver circuit and a drain coupled to a second reference voltage;
   a first n-channel metal oxide semiconductor (NMOS) transistor having a gate coupled to a first bias voltage, a source coupled to the first output of the driver circuit, and a drain coupled to the first reference voltage;
   a second NMOS transistor having a gate coupled to a second bias voltage and a drain coupled to the first output of the driver circuit;
   a third NMOS transistor having a gate coupled to the first control signal, a source coupled to the second reference voltage, and a drain coupled to a source of the second NMOS transistor;
   a fifth PMOS transistor having a gate coupled to the second control signal, a source coupled to the first reference voltage, and a drain coupled to the second output of the driver circuit;
   a sixth PMOS transistor having a gate coupled to the first control signal, a source coupled to the second output of the driver circuit, and a drain coupled to the second reference voltage;
   a fourth NMOS transistor having a gate coupled to the first bias voltage, a source coupled to the second output of the driver circuit, and a drain coupled to the first reference voltage;
   a fifth NMOS transistor having a gate coupled to the second bias voltage and a drain coupled to the second output of the driver circuit;
   a sixth NMOS transistor having a gate coupled to the second control signal, a source coupled to the second reference voltage, and a drain coupled to a source of the fifth NMOS transistor;
   wherein a minimum voltage of the first output of the driver circuit when the first control signal is HIGH is within the range 100 millivolts to 350 millivolts, inclusive;
   wherein a minimum voltage of the second output of the driver circuit when the second control signal is HIGH is within the range 100 millivolts to 350 millivolts, inclusive.

24. A circuit according to claim 23, where the driver circuit further comprises a flip-flop having an input, a first output, and a second output, the second output a complement of the first output;
   wherein the input of the driver circuit is the input of the flip-flop;
   wherein the first output of the flip-flop is coupled to the gate of the fourth PMOS transistor, the gate of the sixth NMOS transistor, and the gate of the fifth PMOS transistor;
   wherein the second output of the flip-flop is coupled to the gate of the third PMOS transistor, the gate of the third NMOS transistor, and the gate of the sixth PMOS transistor.

25. A circuit according to claim 23, where the driver circuit further comprises an inverter having an input and an output;
   wherein the input of the inverter is coupled to the input of the driver circuit;
   wherein the input of the driver circuit is coupled to the gate of the fourth PMOS transistor, the gate of the sixth NMOS transistor, and the gate of the fifth PMOS transistor;
   wherein the output of the inverter is coupled to the gate of the third PMOS transistor, the gate of the third NMOS transistor, and the gate of the sixth PMOS transistor.

* * * * *